United States Patent [19]

Seidler

[11] Patent Number: 5,176,255
[45] Date of Patent: Jan. 5, 1993

[54] LEAD FRAME FOR INTEGRATED CIRCUITS OR THE LIKE AND METHOD OF MANUFACTURE

[75] Inventor: Jack Seidler, Flushing, N.Y.

[73] Assignee: North American Specialties Corporation, Flushing, N.Y.

[21] Appl. No.: 717,681

[22] Filed: Jun. 19, 1991

[51] Int. Cl.⁵ .................. H01R 9/22; B65D 73/02
[52] U.S. Cl. .................. 206/331; 206/330; 228/180.2; 228/212; 29/827; 29/843; 29/884
[58] Field of Search ............ 29/827, 842, 843, 884; 437/220; 228/180.2, 212; 357/70; 206/328, 331, 330

[56] References Cited

U.S. PATENT DOCUMENTS

| | | | |
|---|---|---|---|
| 3,908,075 | 9/1975 | Jackson et al. | 228/180 A |
| 4,054,238 | 10/1977 | Lloyd et al. | 29/827 |
| 4,782,589 | 11/1988 | Dennis | 29/827 |

Primary Examiner—P. W. Echols
Attorney, Agent, or Firm—Darby & Darby

[57] ABSTRACT

A lead frame is provided having a number of leads to be mechanically and electrically connected to a substrate. Retaining members are also provided with the frame to hold the substrate against the leads. The retaining member is preferably disengaged from the substrate simultaneously with the trimming of the leads from the frame after connecting to the substrate.

15 Claims, 5 Drawing Sheets

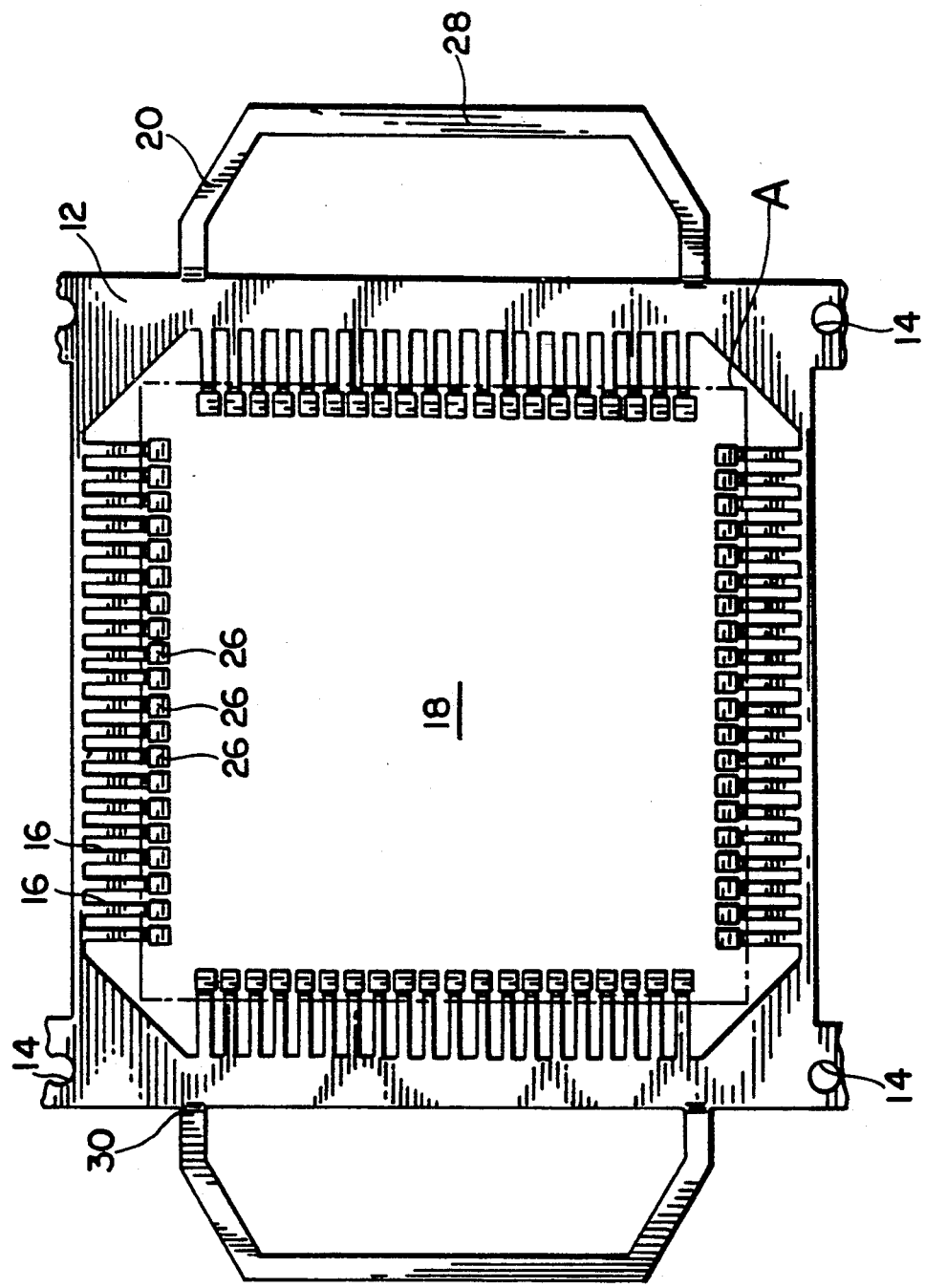

LEAD FRAME FOR INTEGRATED CIRCUITS OR THE LIKE AND METHOD OF MANUFACTURE

FIELD OF THE INVENTION

This invention relates generally to lead arrangement and methods for applying leads to a circuit-bearing substrate. More specifically, the invention relates to a frame for applying leads to integrated circuit chips or chip carriers and methods of producing and applying such lead arrangement.

BACKGROUND OF THE INVENTION

To manufacture an integrated-circuit device, it is necessary to combine two components—the substrate, which could, for example, be an integrated circuit (IC) chip or a chip carrier, and a number of leads that create connections between the substrate and the surrounding electronics. The leads are connected to the substrate at its contact pads, which are exposed electrically conductive areas, usually at the periphery of one face of the substrate.

The speed at which the leads are attached to the substrate is a paramount consideration in the manufacturing process, as higher throughput and thus lower costs can provide the economy needed for successfully meeting competition. Technologies have been designed to attempt to speed the process. A process in common use includes forming a frame with a number of individual leads spaced to correspond to contact pads on the substrate. Solder is then applied to the contact pads on the substrate or the leads. The frame is positioned adjacent the substrate, putting the leads in juxtaposition or direct contact with respective contact pads. In order to hold the leads in contact with their pads during soldering, the substrate is pressed onto the leads. Unfortunately, this can sometimes crack the substrate, which renders it unusable. While being held under pressure, the frame/substrate assembly is heated, causing the solder to melt and, upon cooling, creates an electrical and physical connection between the leads and the substrate.

Typically, heat is applied to the underside of the leads for three to four seconds, melting the solder, which flows between the contact pads and the leads. To prevent movement of the leads while the solder remains in a liquid state, which could result in misalignment and misconnection of the leads, a support and clamp remain in position, holding the components in place until the solder has sufficiently cooled. Typically, this may take about fifteen seconds. Overall, this process requires that a particular lead frame and substrate remain at the soldering station for about 20 seconds.

After soldering is completed, the lead frame is cut away, leaving the ends of the leads extending from the periphery of the substrate, ready for connection to surrounding electronic devices.

The time required at the soldering station for each substrate makes the manufacturing speed and thus the throughput undesirably low for competitive production. Also, the substantial risk of cracking a substrate and having to completely discard the unit adds to the costs involved.

Thus, it is an object of the invention to provide a lead frame that decreases the time the frame and substrate must remain at a soldering station.

It is another object of the invention to provide a lead frame that includes means for retaining a substrate against the lead frame while the solder cools, without risk of damaging the substrate.

It is a further object of the invention to provide a lead frame including means for retaining a substrate against the frame where the retaining means is readily removed at the end of the manufacturing process.

It is yet another object of the invention to provide a lead frame that is economical to fabricate and produces significant savings in applying leads to substrates, in decreased time.

SUMMARY OF THE INVENTION

In accordance with the objects of the invention, a lead frame is provided having a number of leads to be mechanically and electrically connected to a substrate. Retaining means are also provided on the frame to hold the substrate against the leads during soldering and subsequent cooling. The retaining means is preferably disengaged from the substrate simultaneously with the trimming of the leads from the frame.

The foregoing and other objects and advantages of this invention will become apparent to those skilled in the art from the detailed description of a preferred embodiment in conjunction with a review of the appended drawings.

BRIEF DESCRIPTION OF THE DRAWINGS

FIG. 3 is a top view of an individual lead frame according to the invention;

DETAILED DESCRIPTION OF THE PREFERRED EMBODIMENTS

Figure 1:
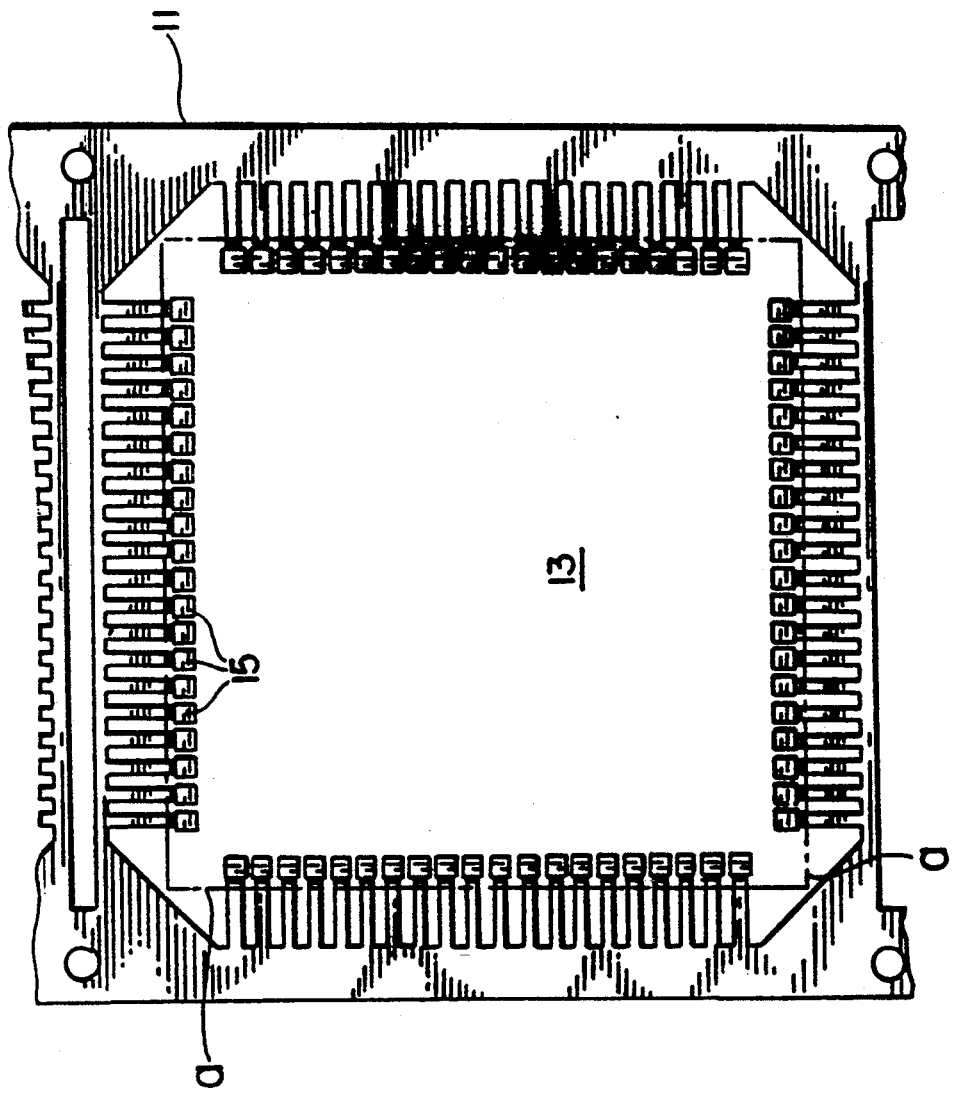
FIG. 1 is a top view of a fragment of a conductive strip having a prior art lead frame.

In the situation where a square or rectangular substrate is to be provided with leads, a correspondingly spaced series of square or rectangular lead frames 11 has been provided in the prior art, as shown in FIG. 1, stamped from a continuous strip of metal. Each frame 11 has a central opening 13, with individual leads 15 extending inwardly from each side of the rim of the frame 11. The number and spacing of the leads 15 corresponds to the number and spacings of the conductive areas of the substrate to which the leads 15 are to be soldered.

In a known process, the contact pads of the substrate are supplied with a solder paste. The substrate is placed on the set of leads 15, as shown by the dotted lines a in FIG. 1, with the contact pads of the substrate resting on the ends of the leads 15. A pressure clamp is applied to hold the substrate in position relative to the frame, while heat is applied, either through the substrate or the leads, to melt the solder. The clamp must hold the frame/substrate assembly in locked position until the solder first melts and then cools to solidify, a cycle typically taking 15 to 20 seconds. Only after the solder solidifies can the frame/substrate assembly be moved out of the clamp at the soldering station.

Figure 2:
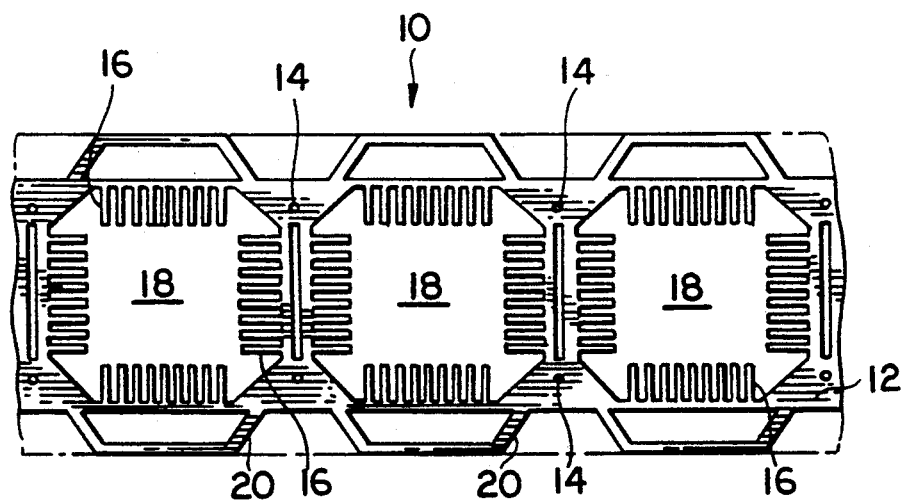
FIG. 2 is a top view of a portion of a strip of lead frames according to the invention.
Figure 6:
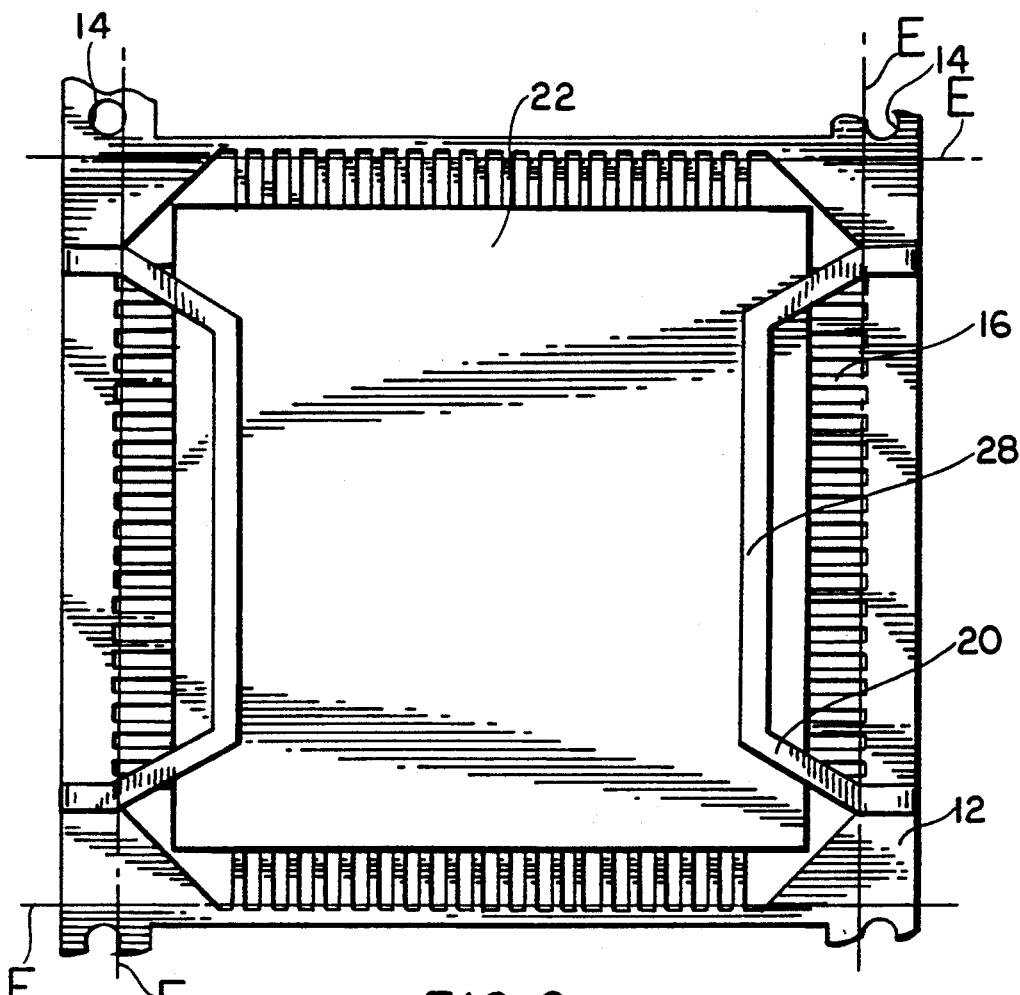
FIG. 6 is a top view of a lead frame/substrate assembly with the retaining arms engaged to the substrate.

Referring now to FIG. 2 of the drawings, a portion of a strip 10 carrying lead frames 12 according to the invention is shown. The individual lead frames 12 can be delineated by indexing holes 14 that are used by a conveyor or indexing apparatus (not shown) to move the strip 10 successively by a fixed distance corresponding to the frame length. Each individual lead frame 12 preferably is comprised of a number of leads 16 surrounding and extending into an interior opening 18. Extending outward from each side of each frame is a retaining arm, shown as a handle-like projection 20. As shown below, when a substrate 22 is placed on the leads 16, the retaining arms 20 may be engaged to the substrate 22 to hold the substrate 22 in place. This will be shown to be particularly useful to hold the substrate 22 in place while previously molten solder cools to form a physical and electrical bond between the substrate 22 and the leads 16.

In FIG. 3, an individual lead frame 12 is shown in greater detail. The frame 12 may be fashioned in any shape to accommodate and match a particular substrate. In the illustrated embodiment, the frame 12 is provided with a square aperture 18, into which extend a number of integral leads 16, which are integral with the frame 12 at their proximal ends.

As described below, the leads 16 extending inwardly from the four sides of the frame 12 create a support for a substrate 22, which will fit in the position marked by the broken line A. The substrate 22 may be any component having at least one conductive area or pad 24, such as an integrated circuit chip or chip carrier or printed circuit board. The leads 16 are positioned and designed such that the distal ends 26 of the leads 16 will be adjacent to respective conductive pads 24 on the substrate 22 when the substrate 22 rests at position A.

Each individual lead frame 12 also includes retaining arms 20, which preferably extend outwardly from the lateral edges of the frame 12. The arms 20, aperture 18, and leads 16 are formed by progressive stamping from a continuous strip of slightly resilient conductive metal (e.g. beryllium copper or phosphor bronze). Thus, in the preferred embodiment, the original blank strip will be at least as wide as the widest portion of the frame 12 and arms 20. The original strip width is shown by dotted lines in FIG. 2. While the arms 20 might be separately formed and suitably attached to the frame 12, such as by welding, this would be unduly costly and time-consuming and is not preferred.

Figure 8:
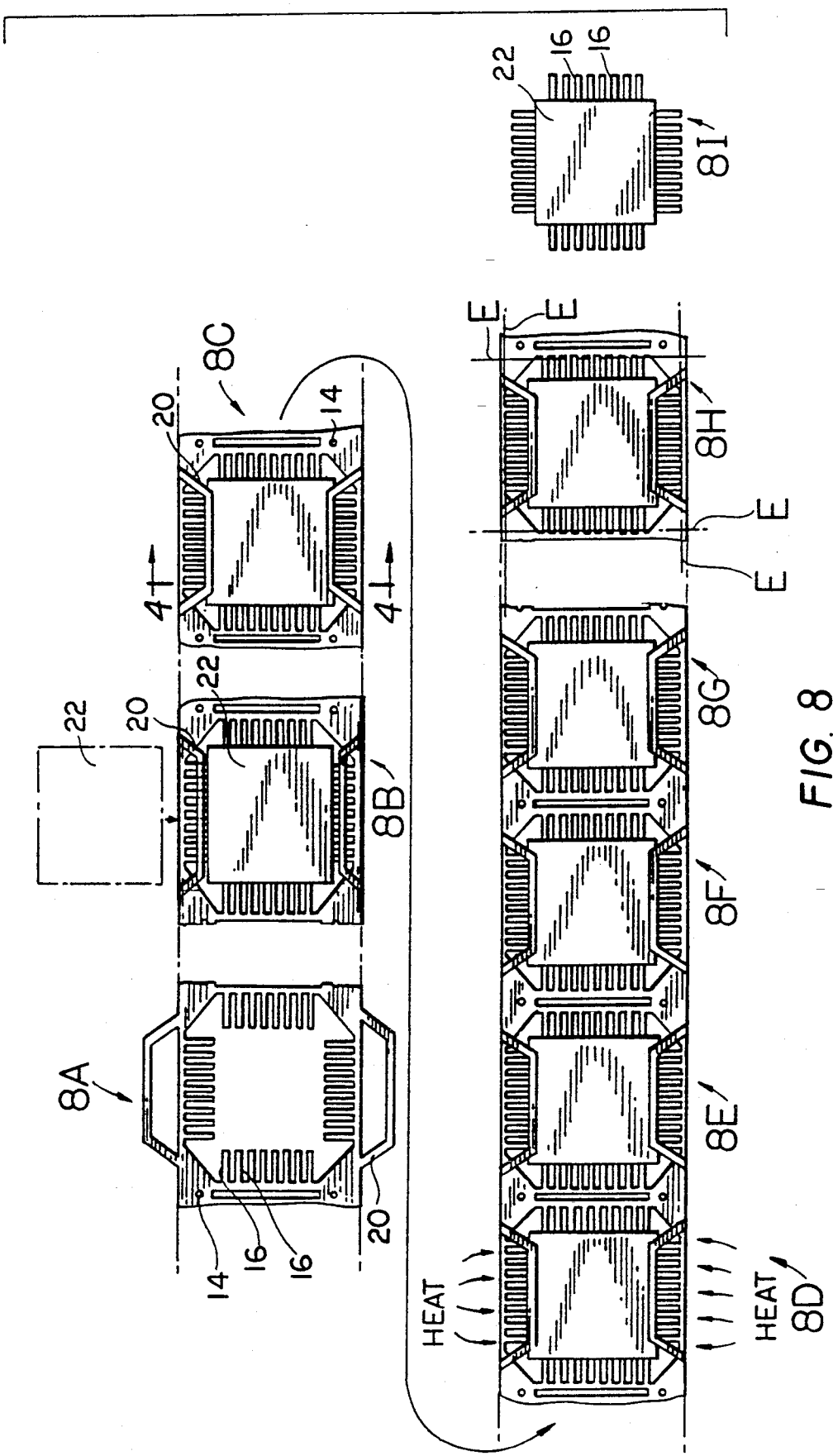
FIG. 8 is a schematic diagram showing the preferred method of use of the lead frame according to the invention.

The process of forming and attaching leads to substrates according to the present invention is shown schematically in FIG. 8. The various lead frame positions, from left to right in FIG. 8, show the progressive stages and operations that produce the final product, i.e., a circuit substrate 22 with a number of leads joined to and extending therefrom. These stages are merely illustrative of the operations on and status of a frame and its corresponding substrate as they are moved along by an appropriate indexing apparatus from workstation to workstation (not shown).

In stage or station 8a, a blank lead frame 12 is seen. The frame 12 may be supplied at that point individually from a hopper, but is preferably supplied from a reel or coil containing many frames in sequence. By the next stage 8b the retaining arms 20 have been partially folded over the leads 16, as seen in FIGS. 4 and 5.

Figure 4:
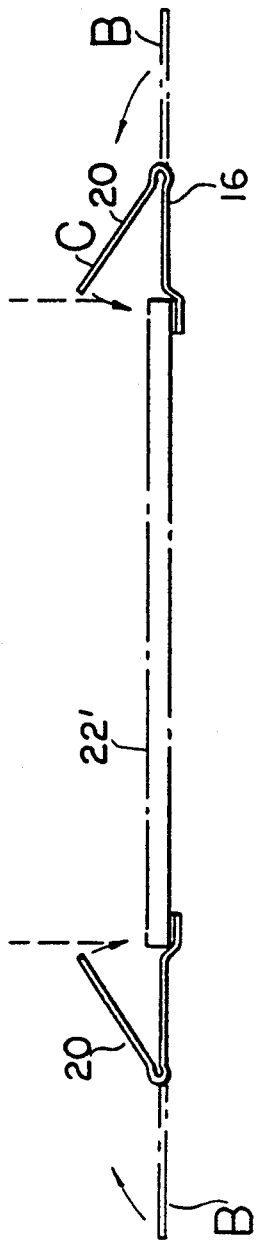
FIG. 4 is a side view of a lead frame with retaining arms prepared to receive a substrate.

FIG. 4 shows a cross-sectional side view of a lead frame 12. As seen in this figure, the arms 20, previously in position B (shown in broken lines) have been partially folded to position C. That position is determined so that the tips of the two opposed arms 20 are separated by a distance greater than the corresponding dimension of the substrate, so that a substrate 22 may pass by the arms 20 and be dropped into the position shown by the broken lines 22' in FIG. 4. FIG. 8 at stage 8b shows this schematically. A substrate 22 is added, with its conductive pads 24 registering with and abutting the distal ends 26 of the lead 16. The substrates 22 may be added automatically to the frames 12 from a hopper, as each frame 12 successively arrives at station 8b. Solder 36 has preferably already been added to either the ends of the leads 16 or to the conductive pads 24, in a suitable manner, not shown.

Figure 5:
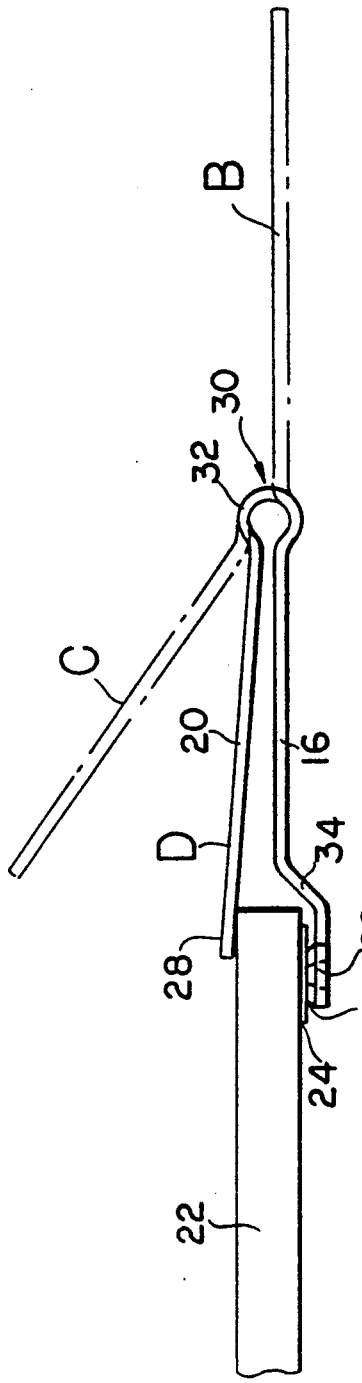
FIG. 5 is a side detail view of the retaining means according to the invention.

Between position 8b and position 8c, the retaining arms 20 are folded down onto the substrate 22, as seen in FIG. 5, to prevent movement of the substrate 22 relative to the frame 12. As illustrated in FIG. 5, the arms 20 have been moved from broken-line position C to position D, where they hold the substrate against the leads 16.

It will be seen in FIG. 5 that at the hinge or bending point 30 between the retaining arms 20 and the frame 12, there is preferably a small circular bend 32. This is formed at an appropriate stage during the progressive stamping process or at the beginning of the arm-bending operation to cause the retaining arms 20 to bend at the hinge point 30, rather than at a random point along their lengths. With the arms 20 are already at position C when the substrate 22 is added, crimping or compressing the hinge point 30 will cause the arms 20 to engage and clamp the substrate 22. This creates a resilient force of the arms 20 down on the substrate 22, sufficient to maintain the substrate 22 in position. In this way, no outside direct force is applied to the substrate 22, avoiding pressures that might crack it.

It can also be seen in FIG. 5 that the outermost edge 28 of the retaining arm 20 when folded over extends into opening 18 sufficiently to overlap and firmly engage the substrate 22. While the retaining arms 20 are shown in the form of a loop or handle, they may be solid, or in the form of multiple outward extending stubs or fingers, or fashioned in any shape, provided only that when they are folded inward, as described, an outer portion 28 will engage the substrate 22 and hold it resiliently in place. It will be understood that the outer portion is desirably straight as shown, but may be curved or corrugated, configured to engage a larger area of the substrate to hold it firmly against the leads 16.

Alternatively, the retaining arms 20 may be left in position B until after the substrate 22 is in place, and subsequently folded over the substrate, although this would add production time, since the folding operation can be more efficiently accomplished before the substrate is added.

As shown in FIG. 5, the leads 16 preferably have a slight bend or jog 34 near the distal end 26 to help properly position the substrate 22 as it comes to rest on the leads 16, although this is not essential.

In FIG. 5, which shows the conjunction of lead 16, the substrate 22 and a retaining arm 20 in greater detail, the lead 16, solder 36 and the conductive pad 24 can be seen in juxtaposition. The solder 36 may be a solder paste, applied to the upper surface of the distal ends 26 of the leads 16, or to the conductive pads 24 of substrate 22. Alternatively, to expedite the soldering process, solder masses may be pre-attached to the lead ends, 26, in any suitable manner, as is common in making solder-bearing leads. Leads of this type are shown, for example in U.S. Pat. Nos. 4,120,558; 4,592,617 and 4,605,278; all to the present inventor. This is preferred as the solder can be applied during the frame production process, avoiding extra steps during the substrate attachment process.

Returning to FIG. 8, at stage 8c, the substrate 22 is in position, held by retaining arms 28 as described in relation to FIG. 4 and 5. By having the downward resilient force of the retaining arms 20 applied near the outer periphery of the substrate 22, the force will tend to keep the pad 24 in contact with the lead 16. Fashioning the retaining arms 20 to extend along the major part of the length of the substrate 22 causes a distribution of force and avoids any local force which may harmfully affect the substrate 22. The substrate 22 will generally be rigid enough so that the two edges not engaged by the retaining arms 20 will not bend.

In this way, the substrate and lead frame are held as an assembly, with each lead in its proper position relative to a conductive pad, as shown in FIG. 5, ready for soldering.

The substrate/frame assembly may then be readily transported directly to a stage 8d, where heat is then applied to the substrate/frame assembly by any conventional means, such as a heat chamber surrounding stage 8d, or by hot gases impinging on the leads 16 at their ends 26. Usually about three to four seconds is sufficient for this. In the prior art, it was necessary thereafter to maintain the frame/substrate assembly at the heating stage in its heating clamp (with the heat turned off) for another 15 to 20 seconds while the solder cools sufficiently to solidify so that leads 16 are joined to the substrate strongly enough to be self-sufficient. With the retaining arms 20 of the present invention, the assembly can be moved out of the heating chamber or stage 8d as soon as the solder has melted, without risk of the substrate 22 shifting relative to the frame. Once out of the chamber, the assembly will begin to cool. In the next 15 seconds or so, three to five more assemblies can be moved into the heating stage, heated and moved out. Thus, the throughput of a soldering station using the invention is a multiple of that of the prior art. This scenario assumes that the assemblies are heated one at a time in a single heating stage. If more than one is heated at a time, by multiple heating stages, the output is simply multiplied. Utilizing the present invention, it is also possible to maintain a constant temperature at the heating stage 8d, rather than constantly cycling a heating clamp by heating and allowing to cool. Positions 8e-8g show assemblies that have already been heated and are now cooling, while the substrate 22 of stage 8d is being heated.

An additional advantage of the retaining arms 20 of the invention lies in their simplicity of release and disposal from the substrate 22. At a subsequent position 8h (FIG. 8), after the solder has solidified, the frame 12 is cut at the four dotted lines E to leave the leads 16 projecting from substrate 22. It can be seen that the arms 20 will also be cut off by this operation. The retaining arms 20 are then discarded with the frame 12. At position 8i, the final product is seen—a circuit substrate 22, with leads 16 extending therefrom, ready for connection to other electronic devices. Of course, discarded metal can be recycled to make a new strip 10, so essentially no extra material is needed for the retaining arms 20.

Figure 7:
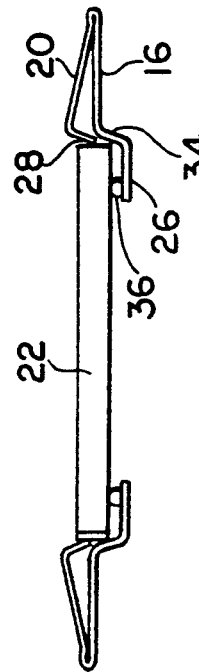
FIG. 7 is a side view of an alternate embodiment of a lead frame according to my invention.

In FIG. 7, an alternate embodiment of the invention is shown, in which the outer edges 28 of the retaining arms 20 are angled toward the lead frame 12. In operation, the retaining arms 20 are fashioned into the position shown in FIG. 7 before insertion of the substrate 22. Upon insertion of the substrate 22, the edges 28 contact the substrate 22 on its side surfaces. The arms 20 flex slightly, allowing the substrate 22 to pass, but frictionally engaging its sides. This frictional force, combined with the resiliency of the retaining arms 20, keeps the substrate 22 firmly in place on the leads 16. Heat is applied to the substrate/frame assembly at position 8d, melting the solder 36. Here again, because of the retaining arms 20, the substrate 22 is held in fixed position with respect to the frame 12, permitting removal from the heating zone before re-solidification of the solder.

While the embodiments of the invention shown and described are all capable of achieving the results desired, it is to be understood that these embodiments have been shown and described for purposes of illustration only and not for purposes of limitation.

What is claimed is:

1. A lead frame for simultaneously connecting a plurality of leads to a circuit substrate having a plurality of conductive areas, comprising:

a frame portion having an inner periphery and an outer periphery;

a plurality of conductive electrical leads having inner and outer ends, each of said leads having its outer end joined integrally with said inner periphery of said frame portion, each of said leads having its inner end free within said frame;

the positions of said inner ends relative to one another corresponding to the positions of conductive areas of said substrate relative to each other; and retaining means joined to and integral with said frame portion for retaining said substrate in contact with said leads, said retaining means comprising at least one retaining arm integral with and extending outwardly from the outer periphery of said frame portion and in a direction away from said leads, said retaining arm being adapted to be folded over said substrate to hold said substrate in relation to said lead inner ends.

2. A lead frame as in claim 1 further comprising a solder mass held by the second end of each of said leads for soldering said second end to a conductive area of said substrate.

3. A strip of lead frames, each of said frames as in claim 1, wherein said frames are connected end to end.

4. A lead frame as in claim 1, wherein said retaining arm is formed of a resilient material such that said substrate is held against said leads with a resilient force.

5. A lead frame for simultaneously connecting a plurality of leads to a circuit substrate, comprising:

a frame portion;

a plurality of conductive electrical leads having first and second ends, each of said leads being joined integrally with said frame portion at the first ends of said leads; and retaining means joined to said frame portion for retaining said substrate in contact with the second ends of said leads, said retaining means being integral with said frame portion;

said substrate having conductive areas, each of said leads also having its second end free, the positions of said second ends relative to one another corresponding to positions of said conductive areas relative to one another;

said retaining means being adapted to hold said substrate on said leads such that said conductive areas are juxtaposed to respective second lead ends;

said retaining means comprising at least one retaining arm extending from said frame portion, said retaining arm being adapted to be folded over said substrate to hold said substrate in relation to said leads; and wherein a portion of said retaining arm when folded is adjacent the first end of said retaining arm when folded is adjacent the first end of at least one of said leads such that said leads and retaining arm may be severed simultaneously from said frame.

6. A lead frame as in claim 5, wherein one of said second lead ends and said conductive areas bear solder material, said retaining means being adapted to maintain the relative position of said areas with said second ends whenever said solder is in a liquid state.

7. A method for simultaneously connecting a plurality of leads to a circuit substrate having a plurality of conductive areas, comprising the steps of:

providing a frame having a plurality of leads extending inwardly of said frame, each of said leads being connected to said lead frame at a first end and having a free second end corresponding to a respective conductive area;

forming on said frame retaining means extending outwardly of said frame for holding said substrate to said leads;

providing solder on at least some of said second lead ends;

positioning said substrate on said lead frame such that said conductive surfaces are juxtaposed respectively to said second ends at the positions of said solder;

engaging said retaining means with said substrate between said leads and said retaining means to hold said substrate in said position;

heating said solder to cause it to melt; and maintaining the relative position of said substrate and said leads by said retaining means while said solder is in a liquid state.

8. A method as in claim 7, further comprising forming said retaining means as at least one arm integral with said frame.

9. A method as in claim 8, further comprising the step of:

detaching said leads from said frame near said first ends and simultaneously detaching said retaining means from said substrate.

10. A method for simultaneously connecting a plurality of leads to a circuit substrate, comprising the steps of:

providing a frame having a plurality of leads, each of said leads being connected to said lead frame at a first end and having a free second end, said substrate having conductive areas corresponding to said free second lead ends;

forming on said frame retaining means for holding said substrate to said leads, said retaining means being arms integral with said frame;

providing solder on one of second lead ends and said conductive areas;

positioning said substrate on said lead frame such that said conductive surfaces are juxtaposed to said second ends with solder therebetween;

engaging said retaining means to hold said substrate in said position;

heating said solder to cause it to melt;

maintaining the relative position of said substrate and said leads by said retaining means while said solder is in a liquid state;

detaching said leads from said frame near said first ends and simultaneously detaching said retaining means from said substrate; and wherein said step of engaging comprises folding said arms over said substrate.

11. A method of manufacturing a lead frame, comprising the steps of:

forming a set of leads integral with a frame, said frame having an inner periphery and an outer periphery, said leads extending inwardly of said frame from said inner periphery, said leads corresponding to conductive areas of a substrate;

forming retaining means integral with and extending outwardly from the outer periphery of said frame and in a direction away from said leads, said retaining means being adapted to retain said substrate in contact with said leads when said substrate engages said leads and said retaining means is folded over said substrate.

12. A method of joining a substrate to a lead frame, wherein said frame has inwardly extending leads corresponding to conductive areas on said substrate, said frame also having integral therewith means extending laterally outward of said frame for retaining said substrate on said leads, comprising the steps of:

placing said substrate on said leads, with solder between said conductive areas and said leads;

engaging said retaining means over said substrate to hold said leads in juxtaposition to said conductive ares with said substrate between said leads and said retaining means;

applying heat to melt said solder at a workstation;

moving said substrate and frame out of said workstation before cooling to permit insertion of another substrate and frame; and allowing said substrate and frame to cool away from said workstation.

13. A lead frame for simultaneously connecting a plurality of leads to a circuit substrate having a plurality of conductive areas, comprising:

a frame portion having four sides, an inner periphery and an outer periphery;

a plurality of conductive electrical leads having inner and outer ends, each of said leads having its outer end joined integrally with said inner periphery of said frame portion, each of said leads having its inner end free within said frame, each side of said frame portion having at least one of said leads joined thereto;

the positions of said inner ends relative to one another corresponding to the positions of conductive areas of said substrate relative to each other; and a retaining arm joined to an integral with one of said sides for retaining said substrate in contact with said leads, said retaining arm extending outwardly from the outer periphery of said one side of said frame portion and in a direction away from said leads, said retaining arm being adapted to be folded over said substrate to hold said substrate in relation to said lead inner ends.

14. A lead frame as in claim 13 comprising two retaining arms joined to and integral with two opposite sides of said frame portion.

15. A strip of lead frames, each of said frames as in claim 14, wherein each of said leads frames is connected to an adjacent lead frame at a side not having a retaining arm extending therefrom.

* * * * *